United States Patent
Strull et al.

(10) Patent No.: US 7,138,886 B2
(45) Date of Patent: Nov. 21, 2006

(54) WIDEBAND CATV SIGNAL SPLITTER DEVICE

(75) Inventors: Yeshayahu Strull, Tel Aviv (IL); Oleg Dounaevski, Netanya (IL); Eli Barshishat, Biyalik (IL)

(73) Assignee: Xtend Networks Ltd., Airport City (IL)

( * ) Notice: Subject to any disclaimer, the term of this patent is extended or adjusted under 35 U.S.C. 154(b) by 50 days.

(21) Appl. No.: 10/513,214

(22) PCT Filed: May 2, 2002

(86) PCT No.: PCT/IL02/00342

§ 371 (c)(1),
(2), (4) Date: May 19, 2005

(87) PCT Pub. No.: WO03/094347

PCT Pub. Date: Nov. 13, 2003

(65) Prior Publication Data

US 2005/0206475 A1    Sep. 22, 2005

(51) Int. Cl.
*H01P 5/12* (2006.01)
*H03H 7/01* (2006.01)

(52) U.S. Cl. ............................ 333/109; 333/124
(58) Field of Classification Search ........... 333/109, 333/110, 124, 125, 126, 129, 132
See application file for complete search history.

(56) References Cited

U.S. PATENT DOCUMENTS

| | | | |
|---|---|---|---|
| 3,491,199 A | 1/1970 | Weinstein et al. | |
| 4,245,245 A | 1/1981 | Matsumoto et al. | |
| 4,506,387 A | 3/1985 | Walter | |
| 4,553,161 A | 11/1985 | Citta | |
| 4,641,363 A | 2/1987 | Hasegawa | |
| 4,970,722 A | 11/1990 | Preschutti | |
| 5,058,198 A | 10/1991 | Rocci et al. | |
| 5,109,286 A | 4/1992 | West, Jr. et al. | |
| 5,130,664 A | 7/1992 | Pavlic et al. | |

(Continued)

FOREIGN PATENT DOCUMENTS

EP    0 577 351 A2    1/1994

(Continued)

OTHER PUBLICATIONS

Video-on-Demand Overview, INTERNET <URL:http://www.cs.tut.fi/tlt/stuff/vod/VODOverview/vod1/html>, Jan. 1995.

(Continued)

*Primary Examiner*—Dean Takaoka
(74) *Attorney, Agent, or Firm*—Pearl Cohen Zedek Latzer, LLP

(57) ABSTRACT

A wideband high frequency signal splitter device utilized in a signal distribution network is disclosed. An input signal having a substantially extended frequency bandwidth is applied to an input port of the proposed signal splitter from the upstream portion of a signal distribution network. Within the signal splitter the signal is suitably divided into its constituent components. The constituent components include a low frequency component, a high frequency component and an AC current power component. The components are divided separately and re-routed to combiner units associated with suitable output ports. The separate components are combined and fed through the output ports to the downstream portion of the signal distribution network. The signal splitter device is also functional as a signal combiner device by combining separate signals received from the downstream portion of the network via the output ports and transmitting the combined signals to the upstream portion of the signal distribution network.

28 Claims, 5 Drawing Sheets

U.S. PATENT DOCUMENTS

| | | |
|---|---|---|
| 5,194,942 A | 3/1993 | Sim et al. |
| 5,194,947 A | 3/1993 | Lowcock et al. |
| 5,218,714 A | 6/1993 | Ishibashi et al. |
| 5,301,245 A | 4/1994 | Endoh |
| 5,481,757 A | 1/1996 | Mihara et al. |
| 5,587,734 A | 12/1996 | Lauder et al. |
| 5,600,573 A | 2/1997 | Hendricks et al. |
| 5,724,646 A | 3/1998 | Ganek et al. |
| 5,768,682 A | 6/1998 | Peyrovian |
| 5,774,458 A | 6/1998 | Williamson |
| 5,790,806 A | 8/1998 | Koperda |
| 5,805,804 A | 9/1998 | Laursen et al. |
| 5,815,146 A | 9/1998 | Youden et al. |
| 5,822,677 A | 10/1998 | Peyrovian |
| 5,963,844 A | 10/1999 | Dail |
| 5,999,970 A | 12/1999 | Krisbergh et al. |
| 6,049,539 A | 4/2000 | Lee et al. |
| 6,253,375 B1 | 6/2001 | Gordon et al. |
| 6,381,745 B1 | 4/2002 | Paul |
| 6,393,607 B1 | 5/2002 | Hughes et al. |
| 6,462,923 B1 | 10/2002 | Vokey |
| 2002/0174435 A1 | 11/2002 | Weinstein et al. |

FOREIGN PATENT DOCUMENTS

| | | |
|---|---|---|
| EP | 0 589 531 A2 | 3/1994 |
| EP | 0 742 658 A2 | 11/1996 |
| EP | 0 695 092 B1 | 10/1999 |
| EP | 0 963 116 A2 | 12/1999 |
| JP | 9299934 | 11/1997 |
| WO | WO 96/08925 | 3/1996 |
| WO | WO 99/14953 | 3/1999 |
| WO | WO 99/16201 | 4/1999 |
| WO | WO 01/10120 | 2/2001 |
| WO | WO 01/22364 | 3/2001 |
| WO | WO 01/41890 | 6/2001 |
| WO | WO 01/60066 | 8/2001 |
| WO | WO 02/33968 A1 | 4/2002 |
| WO | WO 02/33969 | 4/2002 |
| WO | WO 02/33986 | 4/2002 |
| WO | WO 03/049225 | 6/2003 |

OTHER PUBLICATIONS

Multimedia Traffic Engineering for HFC Networks, A White Paper on Data, Voice, and Viseo Over IP, 1999.

"Multiplexing DBS and CATV over a Common Coaxial Distribution Plant" Xtend Networks Company Website, XP002202040 Retrieved from the Internet: <URL:http://www.xtendnetworks.com/images/xtend2.pdf> retrieved on Jun. 13, 2002, May 2001.

"Xtending Cable Bandwith—an Alternative to Node Splitting" Xtend Networks Company Website, XP002202041 Retrieved from the Internet: <URL:http://www.xtendnetworks.com/images/xtend1.pdf>, Oct. 2001.

Electroline Electronic Equipment Inc. Increasing Subscribers & Improving Profitability with Addressable Taps a White Paper AND Going Further in Addressability with the RetroPlate™, Nov. 1999.

Personal Video Recorder (PVR) Meets Video-on-Demand (VOD) First presented at the Society of Cable Telecommunication Engineers (SCTE) 2001 Conference on Emerging Technologies by Bob Chism, Vice President, Development, Concurrent Computer Corporation, 2001.

International Search Report for PCT/IL02/00342, mailed on Jul. 9, 2003.

Search Report for EP 02 72 7999, mailed on May 19, 2005.

WIDEBAND CATV SIGNAL SPLITTER DEVICE

RELATED APPLICATIONS

The present application is generally related to co-pending PCT application no. PCT/IL00/00655 by Zeev Averbuch and Dr. Hillel Weinstein entitled "System and Method for Expanding the Operational Bandwidth of a Communication System", filed 16th Nov. 2000 which is incorporated herein by reference.

BACKGROUND OF THE INVENTION

1. Field of the Invention

The present invention relates generally to CATV distribution systems and more specifically, to a signal splitter device for the distribution and re-combining of CATV downstream and upstream signals having a substantially expanded range of frequencies across two or more output ports associated with the device.

2. Discussion of the Related Art

The nature of typical cable television (CATV) distribution systems is such that the downstream signal carried on the signal transmission line has to be split and re-split many times in order to be distributed to a plurality of receivers from a common signal insertion point. The splitting of the downstream signal is effected by specific electronic devices, typically referred to as signal splitters, installed at specifically spaced locations across the cable plant. In the upstream direction, signals from any potential insertion points should combined at the splitter. In the head-end, signals from individual signal sources are combined to create a common downstream spectrum while downstream signals are split to feed receivers for each service.

The signal splitters that divide the signals among the outgoing CATV network branches must provide several important performance characteristics. The most important characteristic concerns transmission and distribution of a signal having a bandwidth spanning a wide range of frequencies. Currently, a standard CATV signal has a typical bandwidth ranging from about 5 MHz to about 1000 MHz (1 GHz). In the system and method proposed by the above-referenced related invention the substantially expended bandwidth of the CATV signal will include frequencies up to about 3 GHz or higher. At those substantially extended ranges of frequencies, conventional components of the signal splitters do not perform. Another performance standard concerns RF power loss. While being transported across the cable plant from the CATV head-end to the subscriber's premises equipment the signal typically passes through several splitter devices. As any attenuation in a splitter will be multiplied by the number of splitters in the system the signal insertion loss must be uniform over the extended range of frequencies within a small fraction of the decibel. In addition, a CATV splitter must provide good input/output return loss. Therefore, any signals flowing back from one of the output branch circuits should be absorbed by the splitter and not reflected back down the branch circuit. Furthermore, a CATV signal splitter should provide good output isolation. This means that the signal entering or exiting one of the output ports should not appear at another output port. In addition to standard splitter characteristics the CATV signal splitter have to include AC power-passing capabilities by selectively providing current-limited power supplied by a line AC current power inserter along with the RF to the components of the system, such as the amplifiers and the subscriber's premises equipment. Power should be passed through the splitter and be passed to one or more output ports of the signal splitter.

There is therefore a need for a signal splitter which will meet the above-mentioned operational characteristics when operating at a substantially expended bandwidth, which includes usable frequencies up to 3 GHz or above.

SUMMARY OF THE PRESENT INVENTION

One aspect of the present invention regards a signal splitter device to be used in a signal distribution network for the equal and unequal distribution of a signal applied to an input port across at least two output ports. The signal splitter device consists of an input port for the reception of the input signal from an input signal source, a first diplexer device to effect the separation of the input signal into a low frequency component, an AC current power component, and a high frequency component the diplexer device. The first diplexer unit consists of a low pass filtering section for the selection of the low frequency component and the AC current power component, and high pass filtering section to the selection of the high frequency component. The signal splitter device further includes a second splitter unit to accept the high frequency component of the signal and to divide the high frequency component of the signal to a second diplexer unit and a third diplexer unit, a first splitter unit to accept the low frequency component of the input signal, to divide the low frequency component of the signal the second diplexer unit and a third diplexer unit, inductors and capacitors for separating the AC current power component from the low frequency component and the AC current power component fed by the first diplexer unit and to feed the AC current power component to the second diplexer unit and the third diplexer unit, a third diplexer unit to re-combine the high frequency component of the signal, the low frequency component of the signal and the AC power component of the signal and to feed the re-combined signal to a second out port. The third diplexer unit consists of a low pass filtering section for the selection of the low frequency component and the AC current power component, and a high pass filtering section to the selection of the high frequency component. The signal splitter device further includes a second diplexer device to re-combine the low frequency component of the signal, the high frequency component of the signal and the AC power component of the signal and to feed the re-combined signal to the first output port. The second diplexer unit consists of a low pass filtering section for the selection of the low frequency component and the AC current power component, and a high pass filtering section to the selection of the high frequency component. The signal splitter device further includes a first and second output ports to receive the equally divided input signal comprising of the low frequency component, the high frequency component and the AC current component and to feed the equally divided signal to the continuance of the signal distribution network.

A second aspect of the present invention regards a signal splitter device to be used in a signal distribution network for distribution of input signals applied to an input port across at least two output ports. The signal splitter device includes an input port for the reception of the input signal from an input signal source, at least two output ports to receive the divided input signal and to feed the received signals to network termination points, signal component separator devices comprising a low pass filter section and a high pass filter section utilized to affect the separation of the input signal into its constituent components consisting of a low frequency component, an AC current power component and a high frequency component, signal component combiner units comprising a low pass filter section and a high pass filter section utilized to affect the re-combination of the input signal from its separated constituent components consisting of a low frequency component, an AC current power component; and a high frequency component, signal splitter units to accept the high frequency component and the low frequency components of the signal and to divide equally the high frequency component and the low frequency component of the signal, directional couplers to accept the high frequency components and the low frequency components of the signal and divide unequally the high frequency component and the low frequency, and AC current separation units comprising inductors and capacitors to separate the AC current power from the input signal.

All the above aspects of the present invention provide for the division of a RF signal having a substantially extended bandwidth with a frequency range of about 5 MHz to 3 GHz and above.

All the above aspects of the present invention provide for complete AC current power-passing capabilities.

All the above aspects of the present invention provide for superior power loss, output return loss and output isolation values.

BRIEF DESCRIPTION OF THE DRAWINGS

The present invention will be understood and appreciated more fully from the following detailed description taken in conjunction with the drawings in which.

DETAILED DESCRIPTION OF THE PREFERRED EMBODIMENT

PCT Patent application Serial No. PCT/IL00/00655 by Zeev Averbuch and Dr. Hillel Weinstein entitled "System and Method for Expanding the Operational Bandwidth of a Communication System", within which a method and system for the substantial expansion of the usable bandwidth of a CATV network is disclosed, is incorporated herein by reference.

A new and novel wideband cable television (Community Access Television or CATV) signal splitter device is disclosed. The respective portions of the device are identified for convenience as input, and output although the signal splitter unit is also functional as a signal combiner and as such, the terms input and output indicate relative positioning and are not to be construed to require that signal processing and handling occurs in a particular direction in the device.

In the preferred embodiment of the invention, the signal splitter device is utilized in a CATV network or in another signal distribution network and the like. It would be easily perceived by one with ordinary skill in the art that in other preferred embodiments of the invention the splitter device could be utilized in diverse other computing and communications environments such as a satellite communications network, a high-speed data transmission network, a telephone network, and the like.

Figure 1:
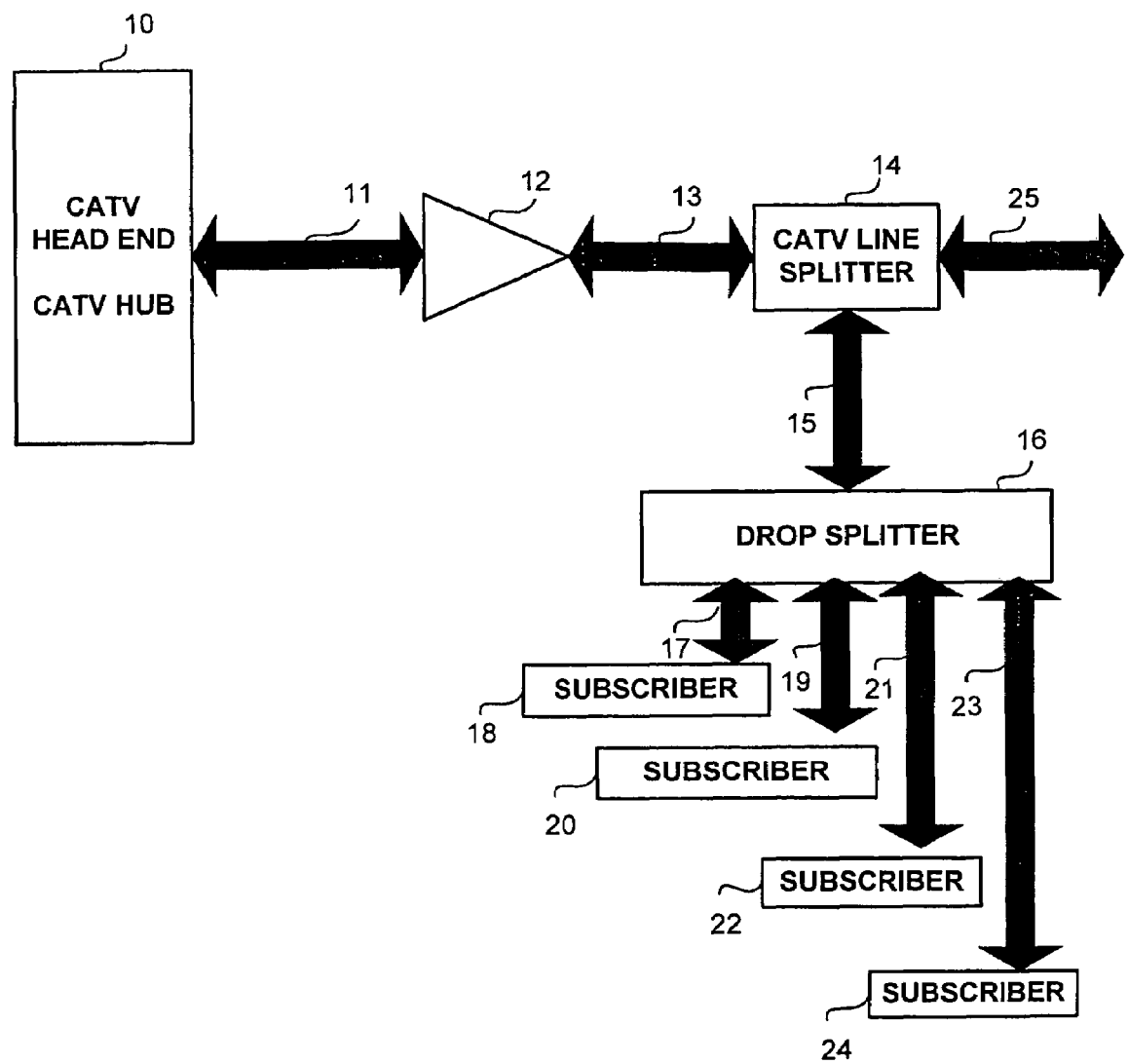
FIG. 1 is a schematic block diagram of a simplified CATV plant.

Referring to FIG. 1 illustrating a simplified block diagram of a cable plant in which the signal splitter device proposed by the present invention could be operative. The simplified cable plant structure as it is illustrated in the drawing includes a CATV head-end and/or CATV hub unit 10, a two-way amplifier unit 12, a CATV line splitter device 14, a drop splitter device 16, a set of subscriber devices 18, 20, 22, 24 and the transmission line segments 11, 13, 14, 15, 17, 19, 21, 23 linking the above-mentioned devices. The transmission media includes typically fiber-optic links, coaxial cables or a combination thereof. A multiplexed two-directional signal carrying diverse information content from diverse information sources and having a substantially extended bandwidth in the range of about 5–3000 MHz is transmitted in the downstream direction from the CATV head-end/CATV hub 10 through the transmission line segment 11 to the amplifier unit 12. From the amplifier 12 the signal is passed via the transmission line segment 13 to the CATV line splitter device 14 designed and developed according to the principles underlying the present invention. The splitter device 14 divides the signal across at least two output ports. One portion of the signal is transmitted along the transmission line segment 25 to the diverse branches dispersed along the rest of the cable plant while the second portion of the combined signal is passed via the line transmission segment 15 to the drop splitter device 16. The drop splitter device 16 re-divides the signal across several output ports where the output ports are connected to the transmission line segments 17, 18, 21, 23 which in turn pass the signal to the subscriber units 18, 20, 22, 24 respectively. As the signal transmission is operative in both the upstream and the downstream from the subscriber devices 18, 20, 22, 24 subscriber-specific signals are passed upstream from the through cable transmission line segments 17, 19, 21, and 23 respectively back to the drop splitter 16. The drop splitter 16 effects the combining of the separate subscriber-specific signals and consequently the combined signal is passed upstream through the transmission line segment 15 to the CATV line splitter device 14. The signal is then re-combined with the additional combined signal passed upstream from the more distant branches of the cable plant by the transmission line segment 25. The re-combined signal is then passed back to the CATV head-end and/or CATV hub unit 10 via the transmission line segment 13, the two-way amplifier 12, and the transmission line segment 11.

Note should be taken that although in the drawing under discussion only a limited number of hub units, amplifier devices, line splitters, drop splitters, and subscriber devices are shown in a realistic configuration the CATV system would include a plurality of hubs, amplifiers, splitters, and subscribers. The description of the preferred embodiment of the present invention is not meant to be limiting to other possible embodiments already contemplated of the present invention. For example in the future the substantially expended bandwidth of the signal could reach frequencies in the excess of 3 GHz. Any number of output ports could be associated with the proposed signal splitter device within the standards known in the art. The relative output power levels achieved could be diverse and could be suitably adjusted according to the differing requirements.

Figure 2:
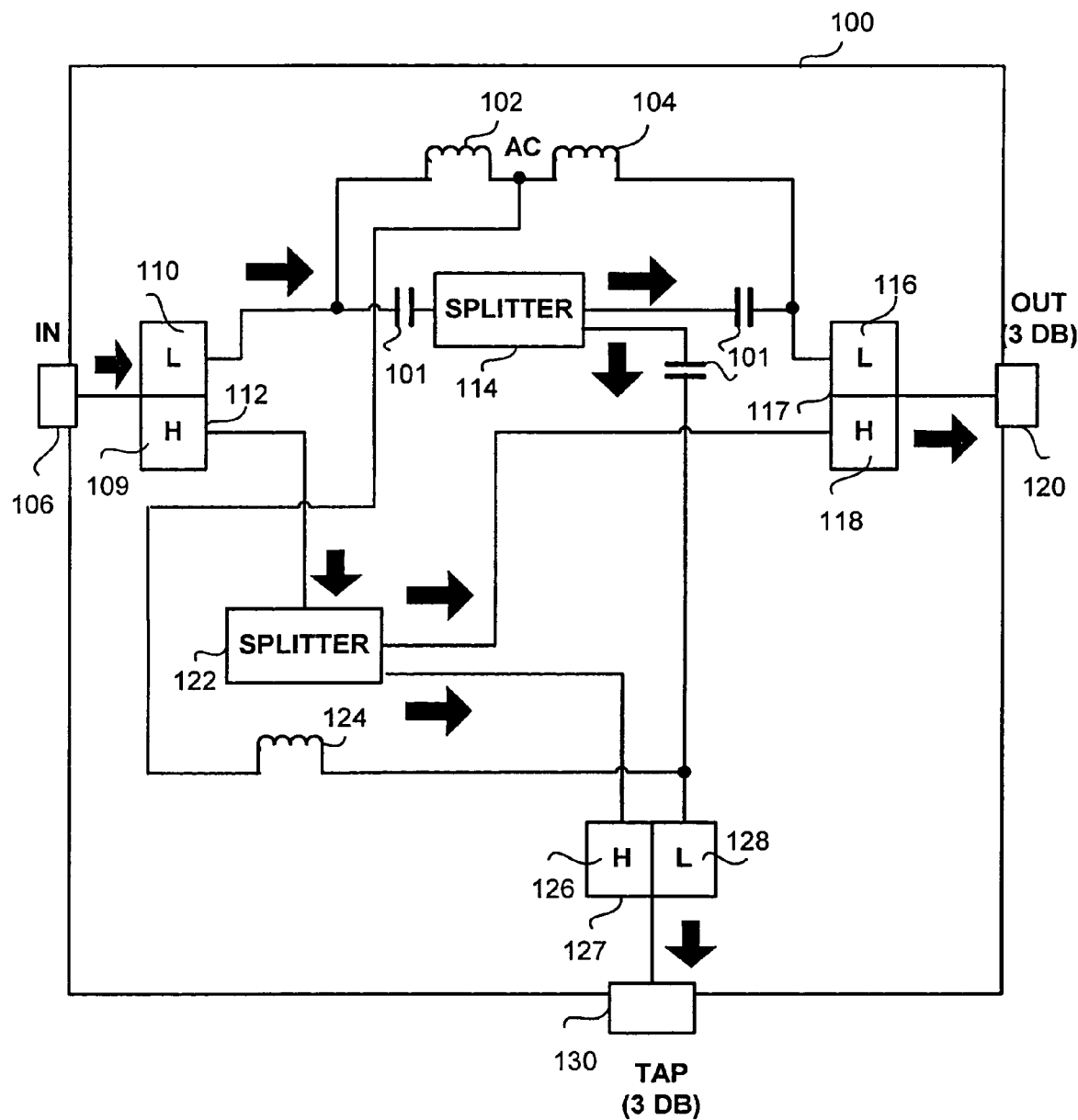
FIG. 2 is a schematic illustration of a signal splitter unit with two output ports, in accordance with a preferred embodiment of the present invention.

Referring now to FIG. 2 that illustrates the structure of the two-port output signal splitter device, according to a preferred embodiment of the invention. The splitter device 100 includes an input port 106, a first output port 120, a second output port 130, a first diplexer 112, a second diplexer 117, a third diplexer 127, a first splitter 114, a second splitter 122, an first inductor 102, a second inductor 104, and a third inductor 124. The first diplexer 112 includes a low pass filtering section 110, and a high pass filtering session 109. The second diplexer 117 consists of a low pass filtering section 116, and a high pass filtering section 118 while the third diplexer 127 includes a low pass filtering session 128 and a high pass filtering session 126. Each low pass filter should have high current passing capability. A combined signal carrying information content transmitted from the CATV head-end and/or CATV hub 10 of FIG. 1 is applied to the input port 106 of the signal splitter device 100. The input signal is fed into the frequency selective circuits of the first diplexer 112. Utilizing the low pass filtering section 110 and the high pass filtering section 109 the first diplexer 112 effects the separation of the signal into a low frequency bandwidth range component, an AC current power component and a high frequency bandwidth range component respectively. The high frequency component is fed into the second splitter unit 122 that divides the signal into two signals. The divided signals are fed respectively to the high pass filter 126 of the third diplexer 127 and to the high pass filter section 118 of the second diplexer 117. The low frequency component signal is fed to the first splitter unit 114 that divides the signal into two identical signals and feds the signal into the low pass filtering session 128 of the third diplexer 127 and to the low pass filtering section 116 of the second diplexer 117. The AC component of the low frequency component signal carrying the power multiplexed with the RF signal is separated from the RF signal by the first inductor 102, high voltage capacitors 101, the second inductor 104, and the third inductor 124 connected in parallel to first splitter unit 114 and the second splitter unit 122. Thus, the AC power signal bypasses the splitters 114, and 122. The separated AC power signal is passed to the low pass filter section 116 of the second diplexer 117 and to the low pas filter section 128 of the third diplexer 127. The second diplexer 117 is connected to the first output port 120. The low frequency bandwidth range component of the signal, the high frequency bandwidth range component of the signal and the AC component of the signal are re-combined by the second diplexer 117 and passed together to the output port 120. The power of the signal at output port 120 is 3 dB lower relative to the signal power at the input port 106. The signal appearing at the first output port 120 is fed to the continuance of the cable plant. Similarly, the third diplexer 127 output port is connected to the second output port 130 of the signal splitter device 100. The third diplexer 127 re-combines the low frequency bandwidth range component of the signal, the high frequency bandwidth range component of the signal and the AC power component of the signal and feds the re-combined signal to the second output port 130. Similarly to the first output port 120 the signal power of the second output port is 3 dB lower relative to the signal power at the input port 106. The signal thus applied to the second output port 130 is fed to the nearest tap device operative in the distribution of the signal among the subscribers serviced by the tap device. Thus, a two-way equal splitting of the CATV the signal is accomplished where the AC power component bypasses the first and second splitters 114, 122 in order to avoid AC choke malfunctioning as a result of the substantially expended frequency range of the combined signal. Note should be taken that the AC current is passed by the low pass filter only. Persons skilled in the art will also appreciate that the signal output level is relative to the input level of the signal and that the various output ports share in identical signal levels. The output levels described above and below serve as examples and it will be appreciated that various other levels can be implemented in different networks and configurations that are clearly contemplated by the present invention.

Figure 3:
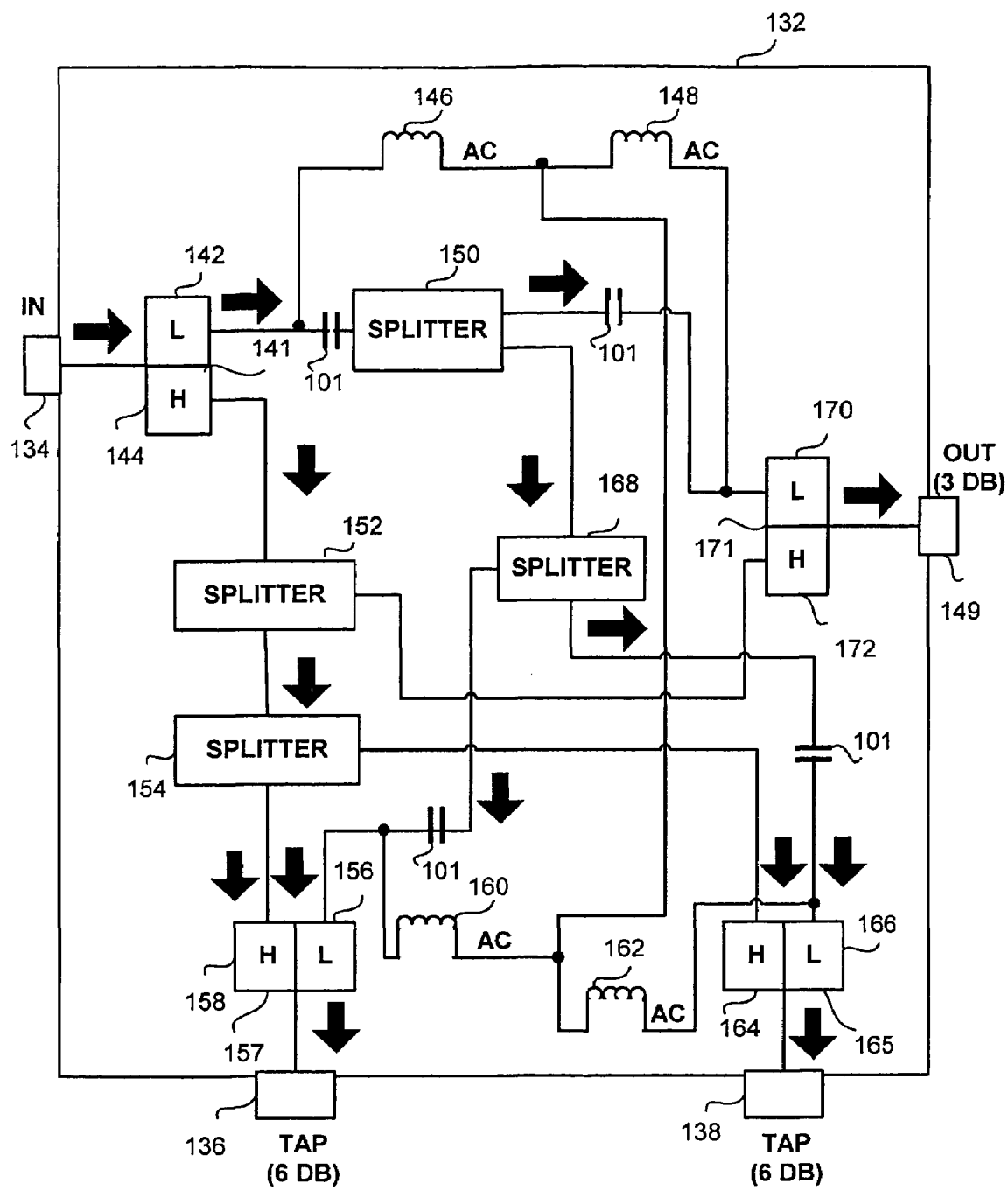
FIG. 3 is a schematic illustration of a signal splitter with three output ports, in accordance with a preferred embodiment of the present invention.

Splitters having more output ports can be fabricated by combining two-way splitters. Each leg of a splitter is connected to the output of another two-way splitter as long as more signal splitting is required. It will be evident to those skilled in the art that plurality output ports splitters are contemplated by the present invention. FIG. 3 shows a simplified block diagram that illustrates the structure of a three-way signal splitter, in accordance with a preferred embodiment of the present invention. The three-way signal splitter device 132 consists of an input port 134, a first output port 149, a second output port 136, a third output port 138, a first diplexer 141, a second diplexer 157, a third diplexer 171, a fourth diplexer 166, a first two-way splitter 150, a second two-way splitter 168, a third two-way splitter 152, a fourth two-way splitter 154, and the inductors 146, 148, 160, 162 connected in parallel to the splitters 150, 168, 152, and 154 respectively. The first diplexer 141 includes a low pass filtering section 142, and a high pass filtering session 144. The second diplexer 157 consists of a low pass filtering section 156, and a high pass filtering section 158, the third diplexer 171 includes a low pass filtering session 170 and a high pass filtering session 172, while the fourth diplexer 166 consists of a low pass filtering section 165 and a high pass filtering session 164. The combined signal transmitted from the CATV head-end and/or CATV hub 10 of FIG. 1 is applied to the input port 134 of the signal splitter device 132. The input signal is fed into the frequency selective circuits of the first diplexer 141. Utilizing the low pass filtering section 142 and the high pass filtering session 144 the first diplexer 141 effects the separation of the signal into a low frequency bandwidth range component and a high frequency component bandwidth range respectively. The low frequency bandwidth range component is fed into the first splitter unit 150 that divides the signal into two identical portions. The two portions are fed respectively to the second splitter device 168 and the low pass filtering section 170 of the third diplexer 171. The two output legs of the second splitter device 168 are fed to the low pass filtering section 165 of the fourth diplexer 166 and the low pass filtering section 156 of the second diplexer 157. The high frequency bandwidth range component of the signal output by the high pass filtering section 144 of the first diplexer 141 is fed into the third splitter unit 154. The output legs of the third splitter device 154 are respectively fed to high pass filtering section 164 of the fourth diplexer 166, and to the high pass filtering section 158 of the second diplexer 157.

Still referring to FIG. 3 the AC component of the low frequency component signal carrying the power multiplexed with the RF signal is separated from the RF signal by the first inductor 146, the second inductor 148, the third inductor 160, and the fourth inductor 162 connected in parallel to first splitter unit 150, the second splitter unit 168, the third splitter unit 152, and the fourth splitter unit 154. Thus, the AC power signal bypasses the splitters 150, 152, 168, and 154. The separated AC power signal is passed to the low pass filtering section 170 of the third diplexer 172, to the low pass filtering session 165 of the fourth diplexer 166, and the low pass filtering session of the 156 of the second diplexer 157. The third diplexer 171 is connected to the first output port 149. The low frequency bandwidth range component of the signal, the high frequency bandwidth range component of the signal and the AC component of the signal are re-combined by the diplexer 171 and passed together to the first output port 149. The power of the signal at the first output port is 3 dB lower relative to the signal power at the input port 134. The signal appearing at the first output port 149 is passed to the continuance of the cable plant. The second diplexer 157 output port is connected to the second output port 136 of the signal splitter device 132. The second diplexer 157 re-combines the low frequency bandwidth range component, the high frequency bandwidth range component and the AC power component of the signal and feds the signal to the second output port 136. The signal power level of the second output port is 6 dB lower relative to the signal power level at the input port 134. The fourth diplexer 166 output port is connected to the third output port 138 of the signal splitter device 132. The fourth diplexer 166 re-combines the low frequency bandwidth range component, the high frequency bandwidth range component and the AC power component of the signal and feds the signal to the third output port 138. Similarly to the second output port 136 the signal power of the third output port 138 is 6 dB lower relative the signal power level at the input port 134. The signal thus applied to the second output port 136 and the signal applied to the fourth output port 138 are fed to suitable tap devices operative in the distribution of the signal among the subscribers of the appropriate cable plant branch. Thus, a three-way splitting of the CATV the signal is accomplished where the AC power component bypasses the first, second, third and fourth splitters in order to avoid AC choke malfunctioning as a result of the substantially expended frequency range of the combined signal.

Figure 4:
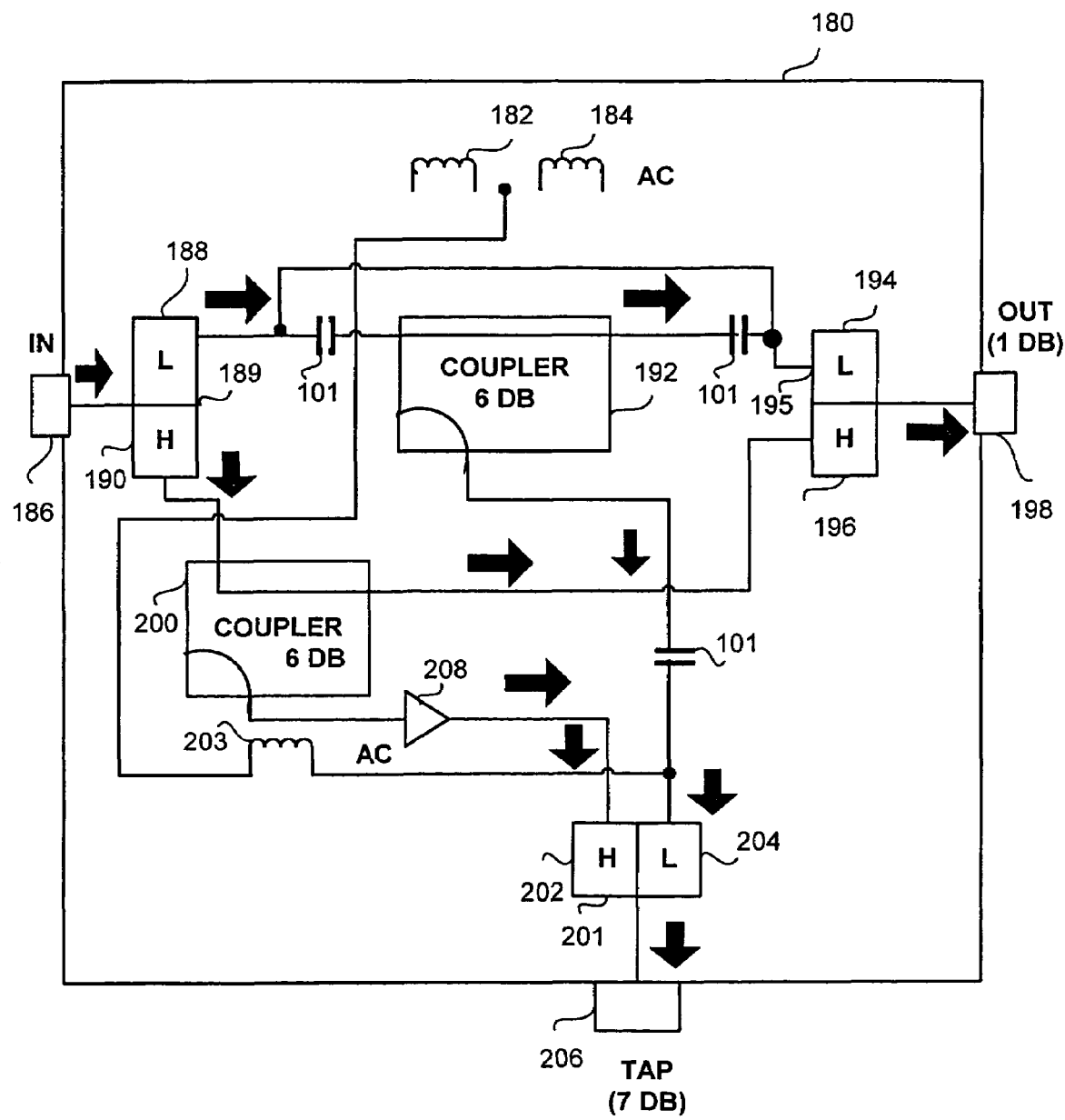
FIG. 4 is a schematic illustrations of a signal splitter for unequal distribution of the signal across two output ports, in accordance with a preferred embodiment of the present invention.

Signal splitting that diverts a pre-defined portion of the signal to a side port is referred to a directional coupling and the electronic units affecting unequal dividing of the signal are called directional couplers. FIG. 4 shows a simplified block diagram that demonstrates the structure of a signal splitter unit utilizing directional couplers for the unequal distribution of the input signal across two output ports. The signal splitter device 180 includes an input port 186, a first output port 198, a second output port 206, a first diplexer 189, a second diplexer 195, a third diplexer 201, a first coupler 192, a second coupler 200, an amplifier 208, a first inductor 182, a second inductor 184, and a third inductor 203. The first diplexer 189 includes a low pass filtering section 188, and a high pass filtering session 190. The second diplexer 195 consists of a low pass filtering section 194, and a high pass filtering section 196 while the third diplexer 201 includes a low pass filtering session 204 and a high pass filtering session 202. The combined signal transmitted from the CATV head-end and/or CATV hub 10 of FIG. 1 is applied to the input port 186 of the signal splitter device 180. The input signal is fed into the frequency selective circuits of the first diplexer 189. Utilizing the low pass filtering section 188 and the high pass filtering session 190 the first diplexer 189 effects the separation of the signal into a low frequency bandwidth range component and a high frequency bandwidth range component respectively. The low frequency bandwidth range component of the signal is fed into the first coupler unit 192 that divides the signal into two. The two portions are fed respectively to the low pass filter 194 of the second diplexer 195 and to the low pass filter section 204 of the third diplexer 201. The high frequency bandwidth range component of the signal is fed to the second coupler unit 200 that divides the signal into two and feds the signal into the high pass filtering session 196 of the second diplexer 195 and to the high pass filtering section 202. of the third diplexer 201 via the amplifier 208. The AC component of the low frequency component signal carrying the power multiplexed with the RF signal is separated from the RF signal by the first inductor 182, the second inductor 184, and the third inductor 203 connected in parallel to first coupler unit 192 and the second coupler unit 200. Thus, the AC power signal bypasses the couplers 192 and 200. The separated AC power signal is passed to the low pass filter section 194 of the second diplexer 195 and to the low pass filtering section 204 of the third diplexer 201.

Still referring to FIG. 4 the second diplexer 195 is connected to the first output port 198. The low frequency bandwidth range component of the signal, the high frequency bandwidth range component of the signal and the AC component are re-combined by the diplexer 195 and passed together to the output port 198. The power of the signal at output port is 1 dB lower relative to the signal power at the input port 186. The signal arriving at the first output port 198 is passed to the continuance of the cable plant. The third diplexer 201 output port is connected to the second output port 206 of the signal splitter device 180. The third diplexer 201 re-combines the low frequency bandwidth range component, the high frequency bandwidth range component and the AC power component of the signal and feds the signal to the second output port 206. The signal power level at the second output port 206 is 7 dB regarding the signal power level at the input port 186 The signal thus applied to the second output port 206 is directed to be passed to the nearest tap operative in the distribution of the signal among the subscribers. Thus, a two-way non-equal splitting of the CATV the signal is accomplished where the AC power component bypasses the first and second couplers 192 and 200 in order to avoid AC choke malfunctioning as a result of the substantially expended frequency range of the combined signal.

Figure 5:
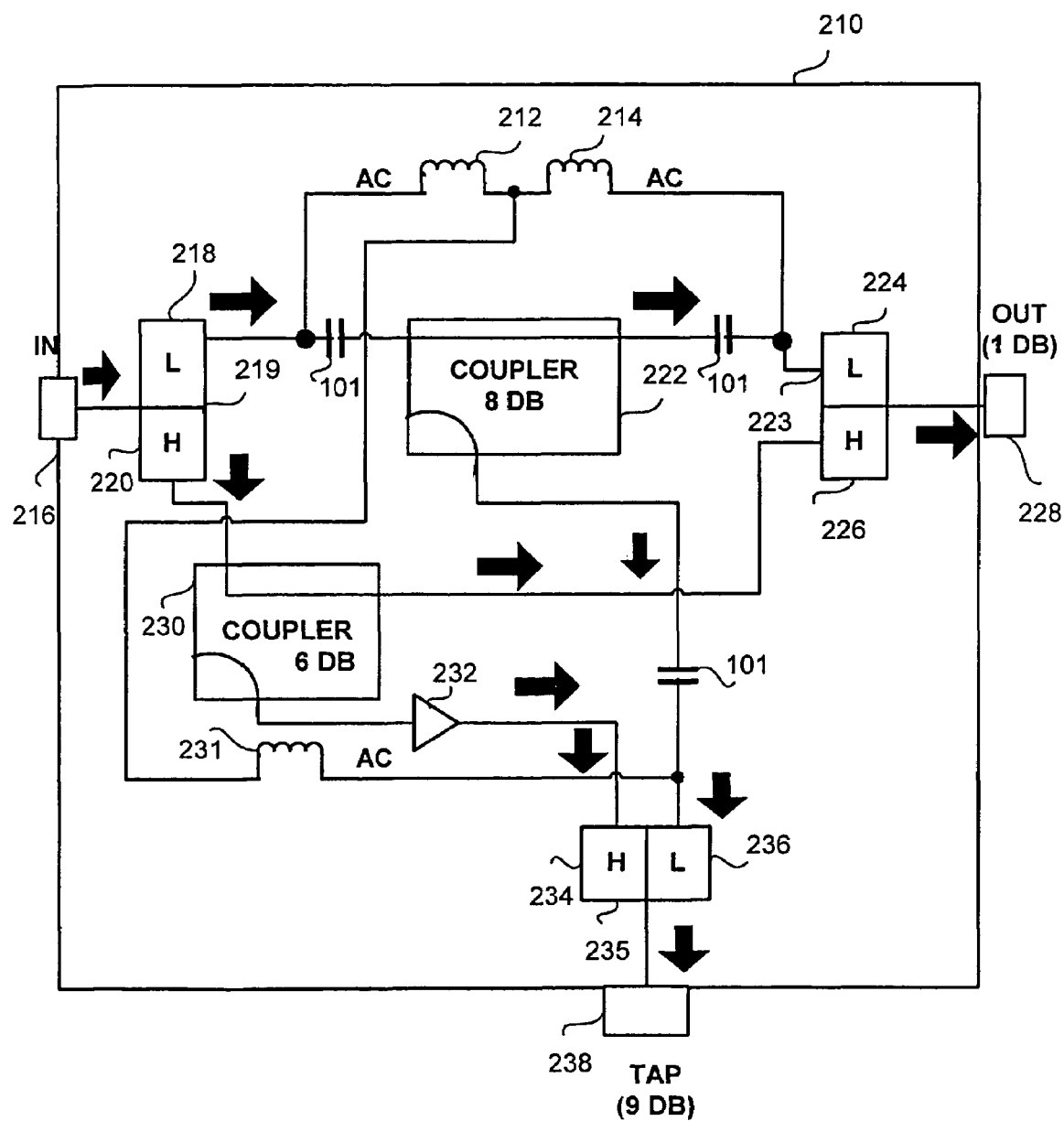
FIG. 5 is a schematic illustration of a signal splitter for unequal distribution of the signal across two output ports, in accordance with another preferred embodiment of the present invention.

FIG. 5 shows a simplified block diagram that demonstrates the structure of an alternative signal splitter unit utilizing directional couplers for the unequal distribution of the input signal across two output ports. The signal splitter device 210 includes an input port 216, a first output port 228, a second output port 238, a first diplexer 219, a second diplexer 223, a third diplexer 235, a first coupler 222, a second coupler 230, an amplifier 232, a first inductor 212, a second inductor 214, and a third inductor 231. The first diplexer 219 includes a low pass filtering section 218, and a high pass filtering session 220. The second diplexer 223 consists of a low pass filtering section 224, and a high pass filtering section 226 while the third diplexer 235 includes a low pass filtering session 236 and a high pass filtering session 234. The combined signal transmitted from the CATV head-end and/or CATV hub 10 of FIG. 1 is applied to the input port 216 of the signal splitter device 210. The input signal is fed into the frequency selective circuits of the first diplexer 219. Utilizing the low pass filtering section 218 and the high pass filtering session 220 the first diplexer 219 affects the separation of the signal into a low frequency bandwidth range component and a high frequency bandwidth range component respectively. The low frequency bandwidth range component of the signal is fed into the first coupler unit 222 that divides the signal into two. The two portions are fed respectively to the low pass filtering section 224 of the second diplexer 223 and to the low pass filtering section 236 of the third diplexer 235. The high frequency bandwidth range component of the signal is fed to the second coupler unit 230 that divides the signal into two and feds the signals into the high pass filtering session 226 of the second diplexer 223 and to the high pass filtering section 234. of the third diplexer 235 via the amplifier 232. The AC component of the low frequency component signal carrying the power multiplexed with the RF signal is separated from the RF signal by the first inductor 212, the second inductor 214, and the third inductor 231 connected in parallel to first coupler unit 222 and the second coupler unit 230. Thus, the AC power signal bypasses the couplers 222 and 230. The separated AC power signal is passed to the low pass filter section 224 of the second diplexer 223 and to the low pass filtering section 236 of the third diplexer 235. The second diplexer 223 is connected to the first output port 228. The low frequency bandwidth range component of the signal, the high frequency bandwidth range component of the signal and the AC component are re-combined by the diplexer 223 and passed together to the output port 228. The power level of the signal at output port 228 is 1 db lower relative to the signal power level at the input port 216. The signal arriving at the first output port 228 is passed to the continuance of the cable plant. The third diplexer 235 output port is connected to the second output port 238 of the signal splitter device 210. The third diplexer 235 re-combines the low frequency bandwidth range component, the high frequency bandwidth range component and the AC power component of the signal and feds the signal to the second output port 238. The signal power level at the second output port is 9 db lower relative to the signal power level at the input port 216 The signal thus applied to the second output port 238 is fed to the nearest tap operative in the distribution of the signal among the subscribers. Thus, a two-way non-equal splitting of the CATV the signal is accomplished where the AC power component bypasses the first and second couplers 222 and 230 in order to avoid AC choke malfunctioning as a result of the substantially expended frequency range of the combined signal.

It will be appreciated by persons skilled in the art that the present invention is not limited to what has been particularly shown and described hereinabove. Rather the scope of the present invention is defined only by the claims, which follow.

We claim:

1. A signal splitter device for the distribution of a signal applied to an input port across at least two output ports comprising:
   an input port for the reception of the input signal from an input signal source;
   a first diplexer device separating the input signal into a low frequency component, an AC current power component, and a high frequency component the diplexer device comprising;
   a second splitter unit to receive the high frequency component of the signal and to divide the high frequency component of the signal to a second diplexer unit and a third diplexer unit;
   a first splitter unit to receive the low frequency component of the input signal, to divide the low frequency component of the signal to the second diplexer unit and to the third diplexer unit;
   at least three inductors and at least three capacitors for separating the AC current power component from the low frequency component and the AC current power component fed by the first diplexer unit and to feed the AC current power component to the second diplexer unit and the third diplexer unit;
   a third diplexer unit to re-combine the high frequency component of the signal, the low frequency component of the signal and the AC power component of the signal and to feed the re-combined signal to a second out port;
   a second diplexer device to re-combine the low frequency component of the signal, the high frequency component of the signal and the AC power component of the signal and to feed the re-combined signal to the first output port;
   at least two output ports to receive the divided input signal comprising of the low frequency component, the high frequency component and the AC current component and to feed the divided signal to the continuance of the signal distribution network.

2. The signal splitter device as claimed in claim 1 wherein the diplexer devices comprise:
   a low pass filtering section for the selection of the low frequency component and the AC current power component;
   a high pass filtering section to the selection of the high frequency component.

3. The signal splitter device as claimed in claim 1 is provided with at least three output ports by the inclusion and interconnection of additional splitter units, diplexer units, inductors and capacitors in suitable combinations.

4. The signal splitter device as claimed in claim 1 is provided with at least four output ports by the inclusion and interconnection of additional splitter units, diplexer units, inductors and capacitors in suitable combinations.

5. The signal splitter device as claimed in claim 1 wherein an unequal distribution of the input signal is accomplished by replacing the splitter units with directional coupler units.

6. The signal splitter device as claimed in claim 1 is provided with the capability of handling signals with a substantially expended frequency bandwidth spanning a range of about 5 MHz through about 3 GHz and above.

7. The signal splitter device as claimed in claim 1 includes complete AC power-passing capabilities.

8. The signal splitter device as claimed in claim 1 provides superior power loss, output return loss and output isolation values well within the required range for splitter devices.

9. The signal splitter device to be used in a signal distribution network as claimed in claim 1 wherein the signal distribution network is a CATV network.

10. The signal splitter device as claimed in claim 1 wherein the device is a CATV line splitter.

11. The signal splitter device to be used in a signal distribution network as claimed in claim 1 wherein the signal distribution network is a satellite communications network.

12. The signal splitter device to be used in a signal distribution network as claimed in claim 1 wherein the signal distribution network is a data transmission network.

13. The signal splitter device to be used in a signal distribution network as claimed in claim 1 wherein the signal source is a CATV head end.

14. The signal splitter device to be used in a signal distribution network as claimed in claim 1 wherein the divided output signals are fed to the network termination points via drop splitters.

15. The signal splitter device as claimed in claim 1 is combines at least two input signals received from at least two input ports and feeding the combined signal via a single output port.

16. The signal splitter device as claimed in claim 1 divides signal in the downstream direction and combines the signal in the upstream direction.

17. A signal splitter device for distribution of input signals applied to an input port across at least two output ports comprising:
- an input port for the reception of the input signal from an input signal source;
- at least two output ports to receive the divided input signal and to feed the received signals to network termination points;
- at least three signal component separator devices comprising a low pass filter section and a high pass filter section utilized for separating of the input signal into its constituent components consisting the at least low frequency component, AC current power component and high frequency component;
- at least three signal component combiner units comprising a low pass filter section and a high pass filter section for re-combining of the input signal from its separated constituent components consisting the at least low frequency component, AC current power component; and high frequency component;
- at least two signal splitter units to accept the high frequency component and the low frequency components of the signal and to divide the high frequency component and the low frequency component of the signal;
- at least two directional couplers to accept the high frequency components and the low frequency components of the signal and divide unequally the high frequency component and the low frequency;
- an AC current separation unit comprising at least three inductors and at least three capacitors to separate the AC current power component from the input signal.

18. The signal splitter device as claimed in claim 17 is provided with at least three output ports by the inclusion and interconnection of additional splitter units, diplexer units, inductors and capacitors in diverse combinations.

19. The signal splitter device as claimed in claim 17 is provided with at least four output ports by the inclusion and interconnection of additional splitter units, diplexer units, inductors and capacitors in diverse combinations.

20. The signal splitter device as claimed in claim 17 provides superior power loss, output return loss and output isolation values well within the required range for splitter devices.

21. The signal splitter device to be used in a signal distribution network as claimed in claim 17 wherein the signal distribution network is a CATV network.

22. The signal splitter device to be used in a signal distribution network as claimed in claim 17 wherein the signal distribution network is a satellite communications network.

23. The signal splitter device to be used in a signal distribution network as claimed in claim 17 wherein the signal distribution network is a data transmission network.

24. The signal splitter device to be used in a signal distribution network as claimed in claim 17 wherein the signal source is a CATV head end.

25. The signal splitter device as claimed in claim 17 is a signal combiner combining at least two input signals received from via at least two input ports and feeding the combined signal via a single output port.

26. The signal splitter device as claimed in claim 17 is a signal splitter in the downstream and a signal combiner in the upstream.

27. A method for signal splitting for the distribution of input signals applied to an input port across at least two output ports, the method comprising:
- receiving the input signal from an input signal source;
- separating the signal into its components consisting of the at least low frequency component, AC current power component and high frequency component, using at least three signal component separator devices comprising a low pass filter section and a high pass filter section;
- combining a signal from its separate components consisting the at least low frequency component, AC current power component; and high frequency component, using at least three signal component combiner units comprising a low pass filter section and a high pass filter section;
- splitting the signals using at least two signal splitter units to accept the high frequency component and the low frequency components of the signal and to divide the high frequency component and the low frequency component of the signal;
- accepting the high frequency components and the low frequency components of the signal and dividing unequally the high frequency component and the low frequency using at least two directional couplers;
- separating the AC power component from the input signal using at least three inductors and at least three capacitors to separate the AC current power component from the input signal;
- thus, receiving via at least two output ports the divided input signal and feeding the received signals to network termination points.

28. The method of claim 27 wherein the step of receiving via at least two ports the divided signal is accomplished across at least three or four output ports.

* * * * *